US012800629B2

(12) United States Patent
Arao

(10) Patent No.: US 12,800,629 B2
(45) Date of Patent: Nov. 17, 2026

(54) POWER CONVERTER

(71) Applicant: Hitachi Industrial Equipment Systems Co., Ltd., Tokyo (JP)

(72) Inventor: Yusuke Arao, Tokyo (JP)

(73) Assignee: Hitachi Industrial Equipment Systems Co., Ltd., Tokyo (JP)

( * ) Notice: Subject to any disclaimer, the term of this patent is extended or adjusted under 35 U.S.C. 154(b) by 260 days.

(21) Appl. No.: 18/724,672

(22) PCT Filed: Nov. 28, 2022

(86) PCT No.: PCT/JP2022/043682
§ 371 (c)(1),
(2) Date: Jun. 27, 2024

(87) PCT Pub. No.: WO2023/153048
PCT Pub. Date: Aug. 17, 2023

(65) Prior Publication Data

US 2025/0102549 A1 Mar. 27, 2025

(30) Foreign Application Priority Data

Feb. 10, 2022 (JP) ................................ 2022-019804

(51) Int. Cl.
*H02P 1/00* (2006.01)
*G01R 23/15* (2006.01)
*H02P 27/06* (2006.01)

(52) U.S. Cl.
CPC .............. *G01R 23/15* (2013.01); *H02P 27/06* (2013.01)

(58) Field of Classification Search
CPC ........ H02P 21/22; H02P 27/06; H02P 29/024; H02P 29/032; H02P 9/107; H02P 29/0241; G05B 11/00
See application file for complete search history.

(56) References Cited

U.S. PATENT DOCUMENTS

2020/0169205 A1 5/2020 Kinomura
2020/0256926 A1 8/2020 Umezawa et al.

FOREIGN PATENT DOCUMENTS

CN 1237024 A * 12/1999 .......... H02J 13/1323
JP 2000-324602 A 11/2000

(Continued)

OTHER PUBLICATIONS

International Search Report (PCT/ISA/210) issued in PCT Application No. PCT/JP2022/043682 dated Feb. 7, 2023 with English translation (5 pages).

(Continued)

*Primary Examiner* — Karen Masih
(74) *Attorney, Agent, or Firm* — Crowell & Moring LLP

(57) ABSTRACT

A power converter comprising, a power conversion unit converts DC voltage to AC voltage corresponding to the device to be operated, a current detection section detects the output current from the power conversion section, a memory section that stores the reference value of the output current detected by the current detection section or the reference value of the value to be monitored from the device to be operated, and the upper and lower limit values determined from the reference value, a control unit controls the power conversion unit, wherein the control unit calculating a frequency of states exceeding the upper limit or the frequency of states below the lower limit, comparing the frequency with a predetermined frequency to determine if there is an abnormality.

9 Claims, 13 Drawing Sheets

(56) References Cited

FOREIGN PATENT DOCUMENTS

| | | | |
|---|---|---|---|
| JP | 6380628 | B1 | 8/2018 |
| JP | 2020-10567 | A | 1/2020 |
| JP | 2020-137145 | A | 8/2020 |
| JP | 2021-114895 | A | 8/2021 |
| WO | WO 2019/230191 | A1 | 12/2019 |

OTHER PUBLICATIONS

Japanese-language Written Opinion (PCT/ISA/237) issued in PCT Application No. PCT/JP2022/043682 dated Feb. 7, 2023 with English translation (5 pages).

Japanese-language Office Action issued in Japanese Application No. 2023-580080 dated Dec. 17, 2024 with English translation (6 pages).

* cited by examiner

POWER CONVERTER

TECHNICAL FIELD

This invention relates to power converter.

BACKGROUND ART

As background technology for power converters, there is a patent document 1. The grid-connected inverter device of the patent document 1 is described as having an input capacitor, an inverter, a filter circuit comprising an inductor and an output capacitor, and a control circuit for controlling the switching operation of the inverter. The control circuit has an abnormality detection section that detects an abnormal state of the output voltage Vo of the filter circuit. It is described that the control circuit controls the output capacitor to discharge the stored charge of the output capacitor to the input capacitor via the inverter when it detects a stand-alone operation state disconnected from the power system based on the detection result of the abnormality detection part.

CITATION LIST

Patent Document

Patent Documents 1: Japanese unexamined patent publication No. 2020-010567

SUMMARY OF THE INVENTION

Problems to be Solved by the Invention

Patent document 1 describes that an abnormal state is detected when the instantaneous frequency exceeds a predetermined upper and lower limit and continues for a predetermined period of time or longer, and the inverter device is stopped. In the mechanism of the patent document 1, the criterion for judgment is constant even if the drive conditions change, and the system stops later when the abnormal state level is reached, even if there is a change in the external environment, especially in the tolerance level on the system side. Therefore, even when the system is desired to operate without stopping as it is, there is an issue that it will stop.

In the mechanism of the patent document 1, if the level to stop is determined by the reason on the relevant device side, the margin is too large even if the customer's system has a normal operating range. In addition, if the customer system tries to determine whether the operation is normal or abnormal as an operation in one cycle period, continuous operation will not be possible if a peculiar phenomenon occurs temporarily and stops the system.

Thus, in the conventional technology, the limit values are not set according to the operation of the customer's system, and especially in a system where the abnormality is to be determined in one cycle of operation, it is difficult to know at which process in one cycle the abnormal condition occurred.

The purpose of this invention is to provide a power converter that can determine that a system is abnormal under conditions that match the operation of the system.

The present invention provides a power converter comprising, a power conversion unit converts DC voltage to AC voltage corresponding to the device to be operated, a current detection section detects the output current from the power conversion section, a memory section that stores the reference value of the output current detected by the current detection section or the reference value of the value to be monitored from the device to be operated, and the upper and lower limit values determined from the reference value, a control unit controls the power conversion unit, wherein the control unit calculating a frequency of states exceeding the upper limit or the frequency of states below the lower limit, comparing the frequency with a predetermined frequency to determine if there is an abnormality.

Effects of the Invention

According to the present invention, it is possible to determine that the system is abnormal under conditions that match the operation of the system.

Problems, configurations and effects other than those described above will be clarified by the following description of the embodiments.

MODE FOR CARRYING OUT THE INVENTION

Examples are described below using the drawings.

Example 1

This example describes the detection of anomalies in various signals sensed by the power converter.

Figure 1:
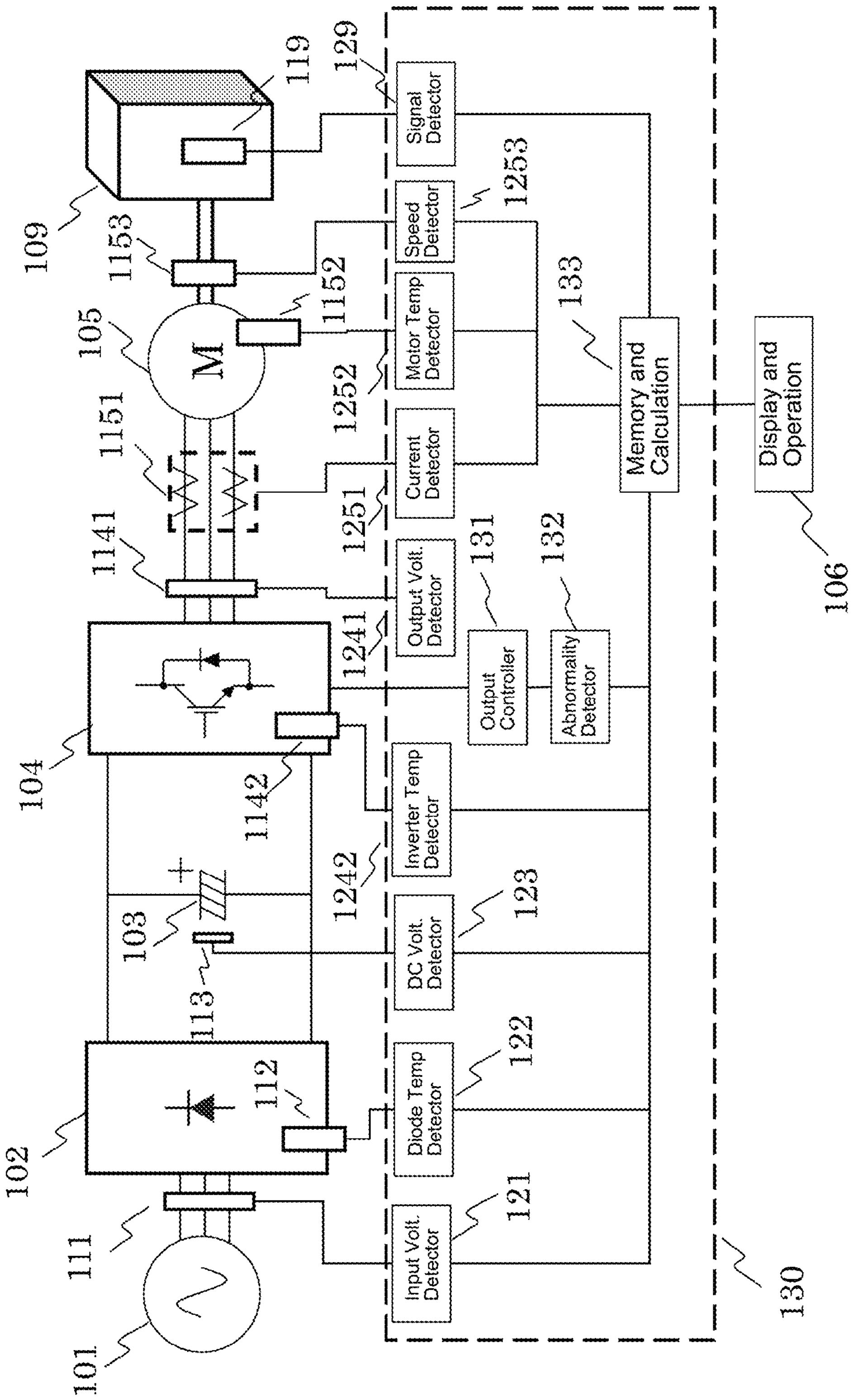
FIG. 1 Example diagrams of power converters in Example 1 and Example 2.

FIG. 1 shows an example of the configuration diagram of the power converter, the AC motor 105, and the system coupled to an electric motor 109 as the equipment to be operated.

This example is including the three-phase AC power supply 101, DC converter 102, smoothing capacitors 103, AC converter 104, display and operation unit 106, input-side voltage detector 111, diode section temperature sensor 112, DC voltage detector 113, output-side voltage detector 1141, inverter section temperature sensor 1142, current detector 1151, electric motor temperature sensor 1152, speed detector 1153, external signal detector 119, input voltage detector 121, diode temperature detection unit 122, DC voltage detector 123, output voltage detector 1241, inverter temperature detection unit 1242, current detection section 1251, electric motor temperature detection unit 1252, speed detector 1253, external signal detector 129, arithmetic unit 130, output control unit 131, abnormal operation judgment unit 132, and memory & calculation unit 133.

The three-phase AC power supply 101 is, for example, three-phase AC voltage supplied by a electric power company or an AC voltage supplied by a generator, which is output to the DC converter 102.

The DC converter 102 consists of, for example, a DC converter circuit composed of diodes or a DC converter circuit using IGBTs and flywheel diodes, and converts the AC voltage input from the three-phase AC power supply 101 into a DC voltage, output it to smoothing capacitors 103. In FIG. 1, a DC converter composed of diodes is shown.

The smoothing capacitors 103 smooth the DC voltage input from the DC converter 102 and output DC voltage to the AC converter 104. For example, if the output of the generator is DC voltage, smoothing capacitors 103 can be input DC voltage directly from the generator without going through DC converter 102.

The AC converter 104 consists of an AC converter circuit using, for example, IGBTs and flywheel diodes, and takes the DC voltage from the smoothing capacitors 103 and the output command from the output control unit 131 as input. The DC voltage is converted to AC voltage and output to the AC motor 105.

For example, the display and operation unit 106 indicates the user interface, which is for example, an operation panel and input/output terminals, and outputs information operated by the user or signals obtained from external devices to the memory & calculation unit 133.

In this example, for example, when the display and operation unit 106 determines the decision time, stability range, tuning state settings, etc., which are set in advance by the user to obtain diagnostic information, the display and operation unit 106 outputs the determined information to the memory & calculation unit 133.

The display and operation unit 106 is a display unit attached to the power converter that can display numerical values, or a communication terminal such as a smart phone located outside, which can display the data stored in memory & calculation unit 133 is displayed as monitor data.

The input-side voltage detector 111 takes the output of the three-phase AC power supply 101 as input, converts the voltage level through a voltage divider circuit, for example, and outputs it to the input voltage detector 121, which consists of an AD converter and a microcomputer.

The diode section temperature sensor 112, for example, consists of a temperature thermistor and converts the temperature of the DC converter 102 into an electrical signal, which is output to the diode temperature detection unit 122.

The DC voltage detector 113 takes the DC voltage of the smoothing capacitors 103 as input, converts the voltage level through a voltage divider circuit, for example, and outputs it to the DC voltage detector 123, which consists of an AD converter and a microcomputer.

The output-side voltage detector 1141 takes the output of the AC converter 104 as input, converts the voltage level through a voltage divider circuit, for example, and outputs it to the output voltage detector 1241, which consists of an AD converter and a microcomputer.

The inverter section temperature sensor 1142, for example, consists of a temperature thermistor and converts the temperature of the AC converter 104 into an electrical signal, which is output to the inverter temperature detection unit 1242.

The current detector 1151 is, for example, a Hall CT or shunt resistor that converts the incoming current into an electrical signal and outputs it to the current detection section 1251.

The electric motor temperature sensor 1152, for example, consists of a temperature thermistor, converts the temperature of the AC motor 105 into an electrical signal and outputs it to the electric motor temperature detection unit 1252.

The speed detector 1153 consists of a rotary encoder, for example, and detects the direct rotational speed of the AC motor 105, or accelerate or shifted speed by attaching gears, etc., and outputs it to the speed detector 1253.

The external signal detector 119 comprises, for example, a temperature sensor, a vibration sensor, or an audio sensor. The external signal detector 119 is a sensor that can extract the operation of the system 109 as an electrical signal, convert the sensor information into an electrical signal and outputs it to the external signal detector 129.

The input voltage detector 121, diode temperature detection unit 122, dc voltage detector 123, output voltage detector 1241, inverter temperature detection unit 1242, current detection section 1251, electric motor temperature detection unit 1252, speed detector 1253, and external signal detector 129 are composed of, for example, an AD converter and a communication module, respectively.

In addition, input voltage detector 121, diode temperature detection unit 122, DC voltage detector 123, output voltage detector 1241, inverter temperature detection unit 1242, current detection section 1251, electric motor temperature detection unit 1252, speed detector 1253, and external signal detector 129 each convert the acquired electrical signals into digital data. The converted digital data is output from each of the above processing units to memory & calculation unit 133.

The arithmetic unit 130 is a device that converts or calculates data, for example, a microcomputer.

The arithmetic unit 130 may consist of multiple elements, but the intent remains the same. The arithmetic unit 130 includes an input voltage detector 121, diode temperature detection unit 122, DC voltage detector 123, output voltage detector 1241, inverter temperature detection unit 1242, current detection section 1251, electric motor temperature detection unit 1252, speed detector 1253, external signal detector 129, output control unit 131, abnormal operation judgment unit 132, and memory & calculation unit 133.

The output control unit 131 is a control unit that calculates command signals to drive the system 109, gives output command signals to the AC converter 104, and outputs output command data to the abnormal operation judgment unit 132.

The abnormal operation judgment unit 132 uses the output command data from the output control unit 131, the data stored in the memory & calculation unit 133, and the data acquired from the sensor as monitor data. The abnormal operation judgment unit 132 takes a preset abnormality judgment data as an input and selectively uses various data as input to determine whether a signal is abnormal or not.

The memory & calculation unit 133 accumulates data acquired from the various data acquisition portions and outputs the data to the abnormal operation judgment unit 132.

The power converter in FIG. 1 is comprising DC converter 102, smoothing capacitors 103, AC converter 104, display and operation unit 106, input-side voltage detector 111, diode section temperature sensor 112, DC voltage detector 113, output-side voltage detector 1141, inverter section temperature sensor 1142, current detector 1151 and arithmetic unit 130. The output-side voltage detector 1141, inverter section temperature sensor 1142, and current detector 1151 may be installed external to the power converter.

Figure 2:
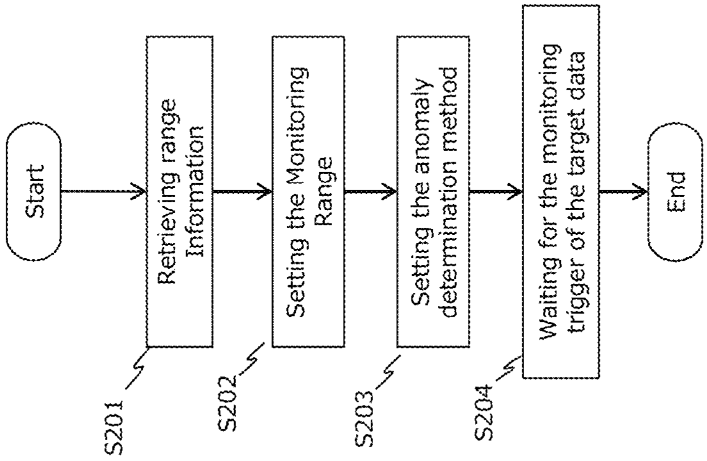
FIG. 2 Flowchart showing the abnormal operation judgment preparation procedure performed by the abnormal operation judgment unit in Example 1 and Example 2.

FIG. 2 is a flowchart showing the preparation procedure for abnormality monitoring performed by the abnormal operation judgment unit 132 in Example 1.

The abnormal operation judgment unit 132 obtains information on the range specification and what is to be monitored, which was previously set in the memory & calculation unit 133 through the display and operation unit 106 (S201).

The abnormal operation judgment unit 132 sets the monitoring range from the acquired information (S202).

The abnormal operation judgment unit 132 sets the judgment method for abnormal judgment (S203). For example, it is set to report externally as an abnormal state when the frequency per unit time that reaches the range of abnormal judgment exceeds a certain level. Or, by setting the judgment means to make an abnormal judgment so that only outliers are detected and an error is issued after one cycle, the operation that suits the system 109 is realized. Here, one cycle represents the time from when the system 109 starts a particular operation until it ends. For example, if the machine is a metal forming machine, it may be a cycle of forming and extruding the product once.

The abnormal operation judgment unit 132 moves to a waiting state waiting for a trigger to monitor the target data (S204).

Figure 3:
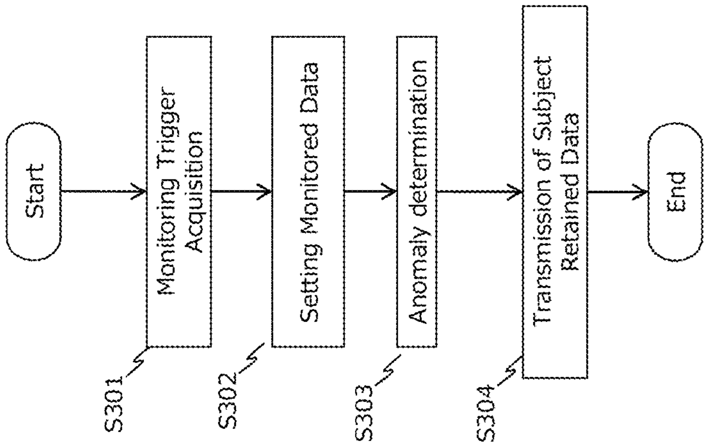
FIG. 3 Flowchart showing the procedure of abnormal operation judgment performed by the abnormal operation judgment unit in Example 1 and Example 2.

FIG. 3 shows a flowchart of the abnormality monitoring judgment procedure performed by the abnormal operation judgment unit 132 in Example 1.

The abnormal operation judgment unit 132 acquires the monitoring trigger and starts the monitoring that has been waiting (S301) starting from the trigger. The monitoring trigger can be, for example, when the power converter operation switch is turned on or when an instruction to start monitoring is received from the customer.

The abnormal operation judgment unit 132 acquires the monitored data and monitors the information to be acquired (S302).

The abnormal operation judgment unit 132 uses judgment means to implement abnormal judgment. For example, when the frequency per unit time that reaches the range of abnormal judgment exceeds a certain level, it is reported to the outside world as an abnormal state, the abnormal judgment is implemented to keep calculating the abnormal state per unit time.

The Or, when detecting only outliers and issuing an error after one cycle, implement abnormal judgment to determine if an error condition has been reached and issue an error when the monitoring trigger is lost, for example. (S303).

The abnormal operation judgment unit 132 keeps the collected data in the memory & calculation unit 133 and transmits the data externally through the display and operation unit 106 (S304). The above shows how to monitor data according to a pre-specified judgment method.

Figure 4:
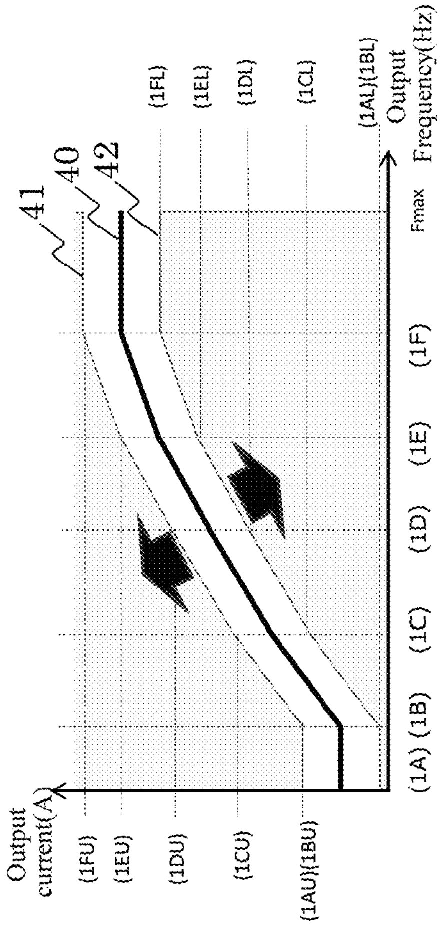
FIG. 4 Example of the range of abnormality judgment in Example 1.

FIG. 4 shows an example of how the abnormal operation judgment unit 132 recognizes the abnormal range as data. The horizontal axis is the output frequency command (Hz) of the power converter, and the vertical axis shows the output current value (A) of the power converter and the monitoring information data from the system 109. In FIG. 4, the horizontal axis (1A) indicates a specific value of the output frequency. For example, (1AU) on the vertical axis represents the maximum output current value when the output frequency is (1A) among the samples of monitored data, and (1AL) represents the minimum output current value when the output frequency is (1A) among the samples of monitored data. The other (2AU) and (2AL) also mean values with similar relationships.

Feedback from the system 109, such as the output of a hydrometer that detects water pressure, is fed back monitor information data via the external signal detector 129. The corresponding monitor information data from the steady-state driving conditions is obtained by the abnormal operation determination unit 132.

In FIG. 4, the abnormal operation judgment unit 132 sets the reference value 40, and sets the upper and lower limits 41 and 42, respectively, with the likelihood of a certain range above and below the reference value 40.

The abnormal operation judgment unit 132 judges that the state in which the output current is higher than the upper limit value 41 (the area indicated by the upper arrow) is the state in which the upper limit has elapsed, and the state in which the output current is lower than the lower limit value 42 (the area indicated by the lower arrow) is the state in which the lower limit is below the lower limit.

A region to be judged as normal is set for a point (reference value 40) on a predetermined basic two-dimensional plane. The area to be judged as normal is the area between the upper limit value 41 and the lower limit value 42.

The abnormal operation judgment unit 132 judges as abnormal when the frequency of data transitions outward from the area between the upper limit 41 and the lower limit 42 increases, with the area between the upper limit 41 and the lower limit 42 as the center.

Figure 5:
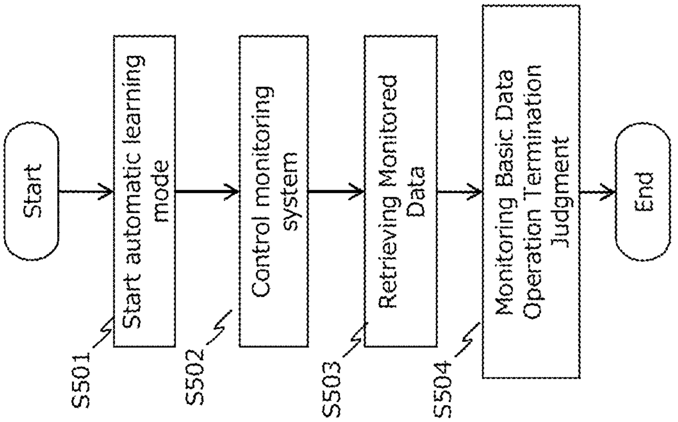
FIG. 5 Flowchart of the abnormal operation judgment unit in Example 1 and Example 2.

Alternatively, the abnormal operation judgment unit 132 may determine abnormality by increasing the weight of abnormality as it moves away from the area to be judged as normal, and increasing the abnormality even if the frequency is less as it moves outward, and then judging it to be abnormal. FIG. 5 shows a flowchart of the procedure for obtaining abnormality monitoring information by the abnormal operation judgment unit 132 in Example 1.

The abnormal operation judgment unit 132 initiates the automatic learning mode specified through the display and operation unit 106 (S501).

The abnormal operation judgment unit 132 reads the operation of the system 109 specified by the customer in advance and controls the system 109 according to the pattern to be monitored (e.g., controlling the output frequency of the power converter according to customer requirements). (S502).

The abnormal operation judgment unit 132 repeatedly obtains information on normal patterns while controlling the system 109 (S503).

The abnormal operation judgment unit 132 continues to retain the data collected in memory & calculation unit 133. The amount of monitoring data that can be used to determine abnormalities may be, for example, 100 cases acquired for each predetermined point. Here, as a predetermined point, the output frequency of the power converter is converted up and down in a predetermined range, the output current corresponding to the change is measured, and when a sufficient amount of monitoring data is obtained, the basic monitoring data operation is terminated. Or, when the end is specified through the display and operation unit 106, the automatic learning is terminated and the basic monitoring data operation is terminated (S504).

Figure 6:
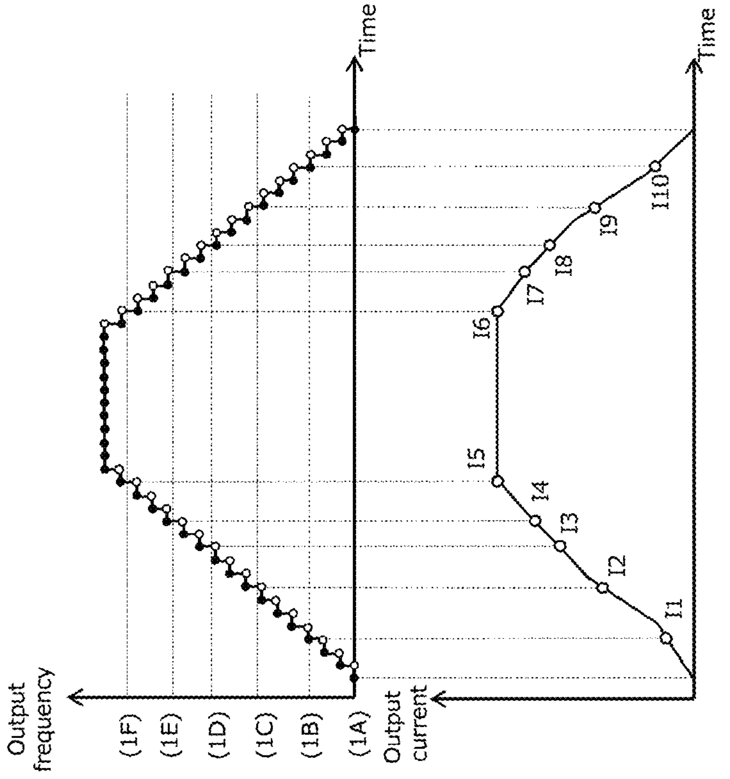
FIG. 6 Data obtained by the abnormal operation judgment unit in Example 1.

FIG. 6 shows the data information that the abnormal operation judgment unit 132 plots as the operating range during automatic learning. In the upper graph in FIG. 6, the vertical axis shows the output frequency of the power converter and the horizontal axis shows the time in automatic learning and the horizontal axis indicates the time in automatic learning. The output frequency (1A), for example, corresponds to the value on the horizontal axis in FIG. 4.

In the lower graph in FIG. 6, the vertical axis shows the output current value of the power converter and the horizontal axis shows the time in automatic learning. For example, I1 shows the output current value at output frequency (1B). The output frequency may be obtained from the data from the speed detector 1253 or the output frequency command value calculated by the output control unit 131. The output current value uses data from current detection section 1251.

Figure 7:
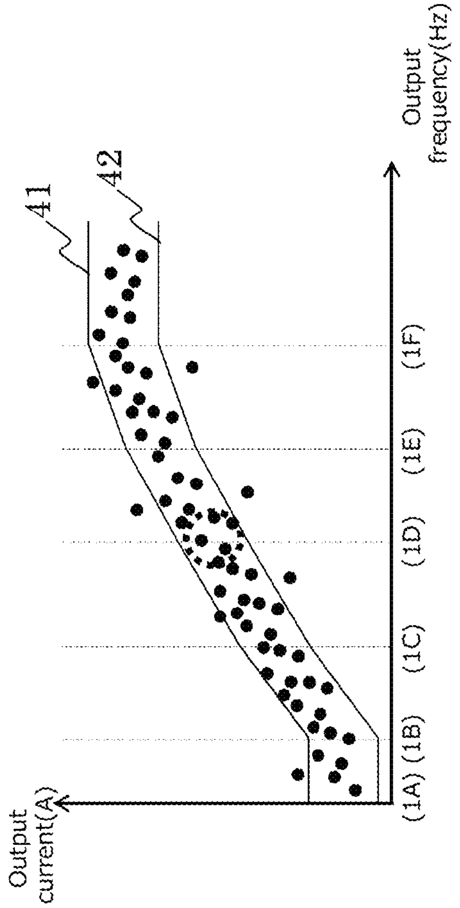
FIG. 7 The figure shows the data stored in the memory & calculation unit in Example 1.

FIG. 7 is a diagram in which the plotted information is expressed as two-dimensional information, and shows that the power converter is operating in a normal range as a result. The vertical axis of FIG. 7 shows the output current (A) and the horizontal axis shows the output frequency (Hz). The data shown in FIG. 6 can be obtained multiple times, and the acquired data can be summarized to obtain a graph containing the individual data indicated by the circles in FIG. 7.

From the data in the graph in FIG. 7, the abnormal operation judgment unit 132 may set the reference value 40 in FIG. 4 by calculating the average output current for each output frequency. Alternatively, the reference value may be determined in advance according to customer requirements. The upper and lower limits 41 and 42 are calculated by the abnormal operation judgment unit 132 from the set reference values and likelihood.

Figure 9:
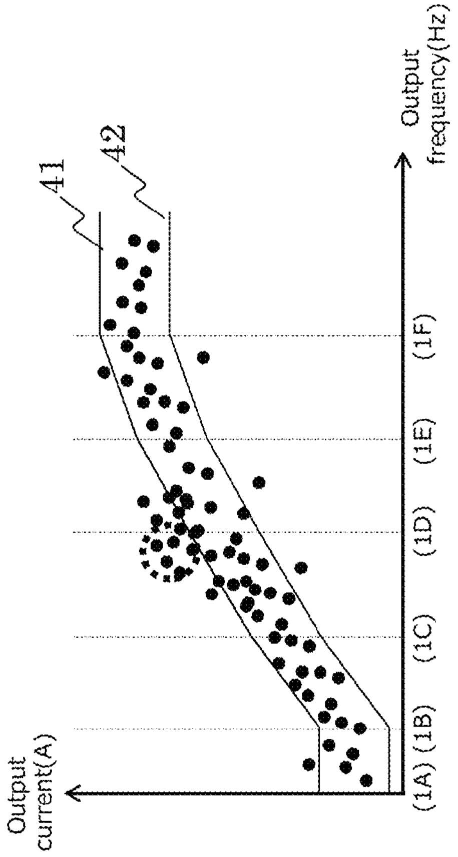
FIG. 9 This figure shows the frequency of the occurrence of abnormal data judged by the abnormal operation judgment unit in Example 1.

The abnormal operation judgment unit 132 sets threshold values such as the upper limit 41 and lower limit 42 shown in FIG. 7 and FIG. 9 so that the range where the frequency occupied by a detection point is 80%, for example, is normal by using the information being automatically learned, and determines the normal range and range of normality is defined as the information.

Figure 8:
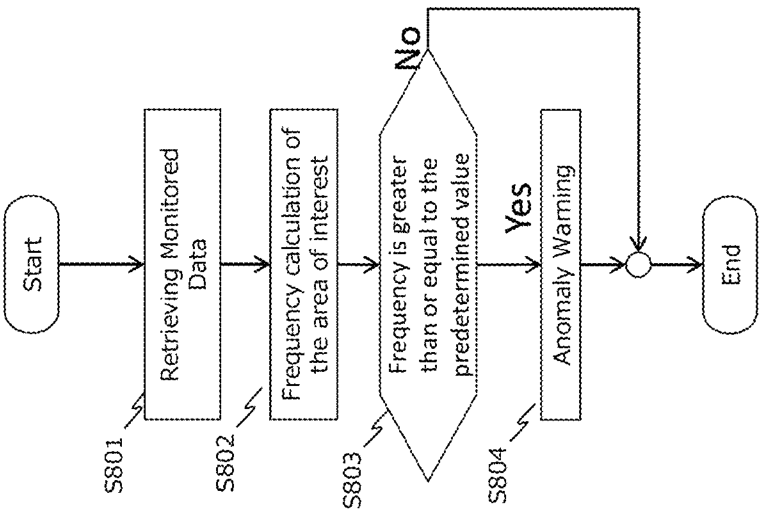
FIG. 8 Flowchart of abnormal judgment in Example 1 and Example 2.

FIG. 8 shows a flowchart of the abnormality judgment procedure performed by the abnormal operation judgment unit 132 in Example 1. The abnormal operation judgment unit 132 acquires the data to be monitored (S801).

When monitored data exceeds the upper limit of 41, as shown in the dashed circle in FIG. 9, the abnormal operation judgment unit 132 calculates the frequency per unit time of the data exceeding the upper limit of 41. For example, the frequency can be calculated as the number of monitored data exceeding the upper limit of 41 per unit time. When monitored data below the lower limit of 42 occur, the abnormal operation judgment unit 132 calculates the frequency per unit time of monitored data below the lower limit of 42 (S802).

Next, the abnormal operation judgment unit 132 compares the frequency calculated in S802 and the predetermined frequency defined and determine if the frequency is above the predetermined frequency (S803). If the frequency calculated by S802 is equal to or greater than a predetermined frequency (Yes in S803), an alarm is issued as an abnormality (S804). If the frequency calculated in S802 is less than the predetermined frequency (No in S803), the abnormal judgment procedure is terminated.

According to this example, the system can be determined to be abnormal under conditions that match the operation of the system.

Example 2

This example is a variation of Example 1, and the configuration of Example 2 has the same function as the configuration with the same code shown in FIG. 1, which has already been explained, so their description is omitted.

In Example 2, the system coupled to an electric motor 109 is a system that repeats one particular cycle. In this example, the operation takes a specific pattern as monitor information in the passage of time of a certain cycle.

Figure 10:
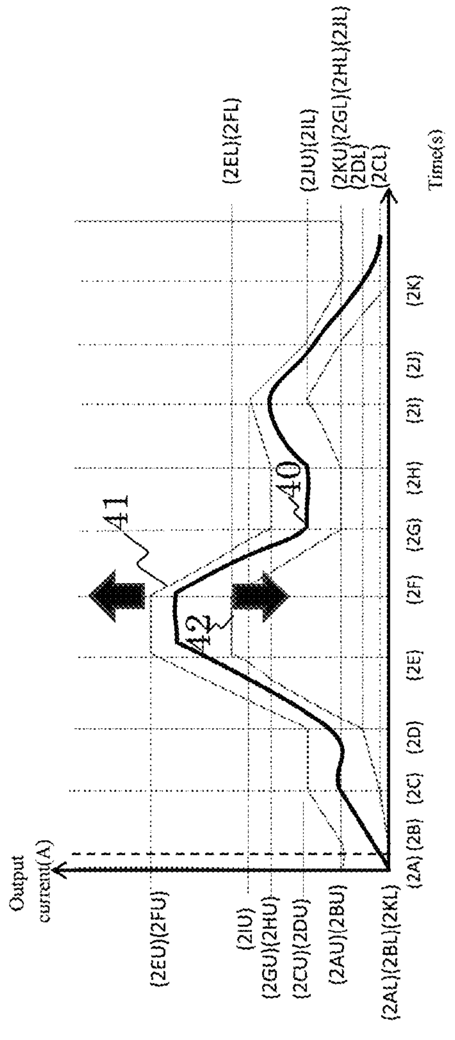
FIG. 10 Example of the range of abnormal judgment in Example 2.

FIG. 10 shows an example of how the abnormal operation judgment unit 132 recognizes the abnormal range as data. The horizontal axis is the elapsed time(s), and the vertical axis shows the output current value (A) and monitor information data. Feedback from the system 109, for example, torque output of the system 109, is used as feedback to obtain the corresponding monitor information data from periodic drive conditions. The abnormal operation judgment unit 132, as described in Example 1, sets 40 reference values, 41 upper limit value 41, and lower limit value 42.

The abnormal operation judgment unit 132 judges that the state in which the output current is higher than the upper limit value 41 (the area indicated by the upper arrow) is the state in which the upper limit has elapsed, and the state in which the output current is lower than the lower limit value 42 (the area indicated by the lower arrow) is the state in which the lower limit is below the lower limit.

As shown in FIG. 10, a region to be judged as normal is set for a point (reference value 40) on a predetermined basic two-dimensional plane. The area to be judged as normal is the area between the upper limit value 41 and the lower limit value 42. The abnormal operation judgment unit 132 judges an abnormality when increase the frequency of data transitions outside of the region centered on the region between the upper limit 41 and lower limit 42, which is the region to be judged as normal.

Alternatively, the abnormality weight may be increased as one moves away from the area to be judged as normal, and the farther outward, the higher the abnormality weight, even if the frequency is low, so that the abnormal operation judgment unit 132 judges it to be abnormal.

Figure 11:
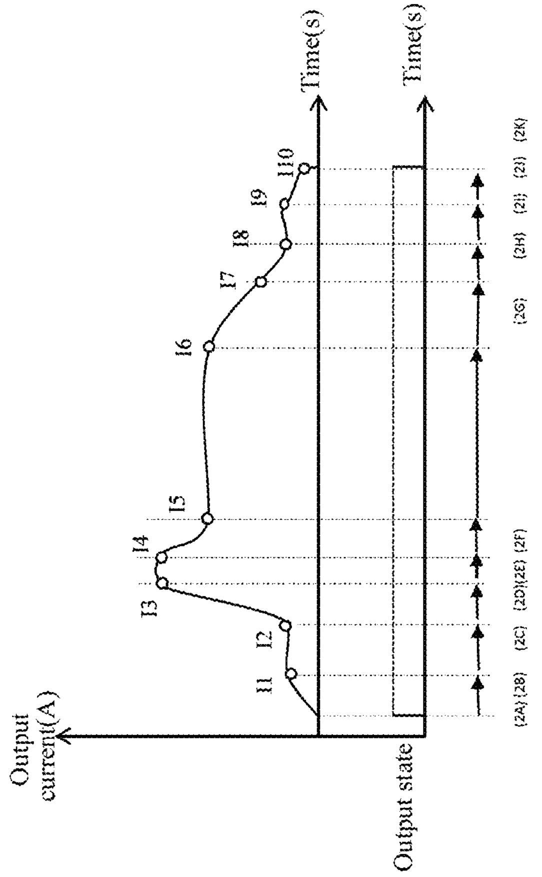
FIG. 11 Data obtained by the abnormal operation judgment unit in Example 2.
Figure 12:
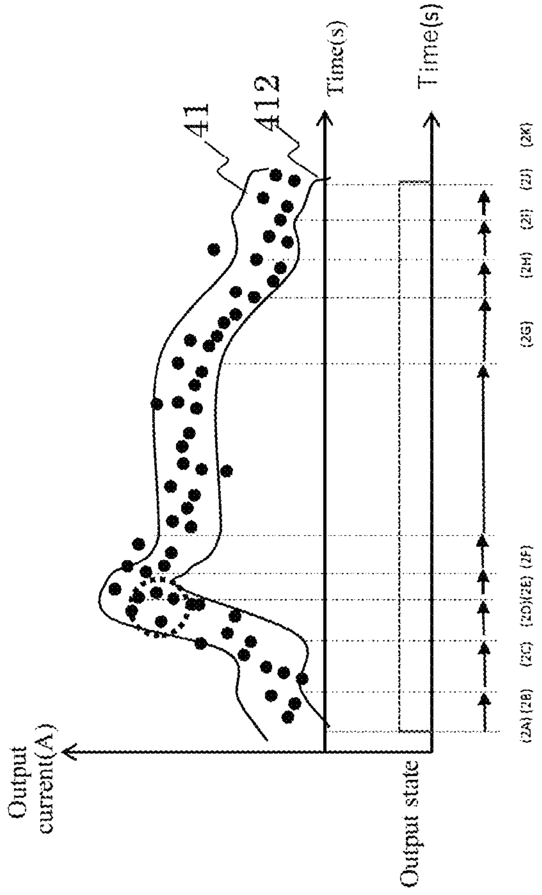
FIG. 12 This figure shows the data stored in the memory & calculation unit in Example 2.
Figure 13:
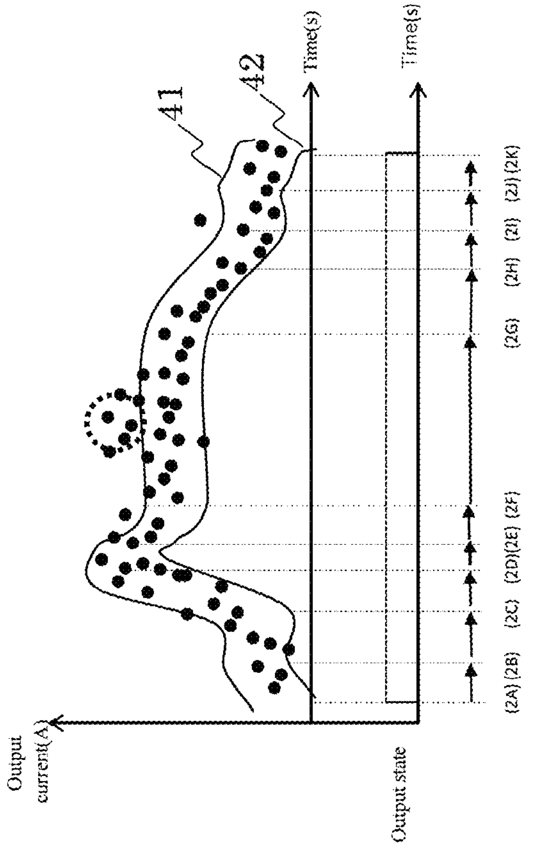
FIG. 13 Frequency of occurrence of abnormal data judged by the abnormal operation judgment unit in Example 2.

FIG. 11 shows the data information that the abnormal operation judgment unit 132 plots as the operating range during automatic learning. FIG. 12 is a diagram in which the plotted information is expressed as two-dimensional information and shows that the power converter is operating in a normal range as a result. In FIGS. 11 through 13, the output state on the vertical axis represents one cycle. 1 cycle corresponds to the state between the rising and falling edges.

FIG. 8 shows a flowchart of the abnormality judgment procedure performed by the abnormal operation judgment unit 132 in Example 2. The abnormal operation judgment unit 132 acquires the data to be monitored (S801).

Next, the frequency is calculated as in S802 of Example 1. For example, suppose that data occurs outside the target area, such as the data in the dashed circle in FIG. 13. In such a case, the abnormal operation judgment unit 132 may weight the data so that the frequency of data generated per unit time increases as the data moves away from the upper or lower limit value.

In this case, the frequency is calculated so that the further away from the upper or lower limit value, the higher the frequency contribution (S802). For example, the likelihood from the upper limit is a predetermined range, and the calculation is such that the number of occurrences per case is weighted at 120% of that likelihood, and the number of cases is higher than when they occur at 110% of the likelihood. In this way, the degree of abnormality can be correctly ascertained.

Next, as in Example 1, the abnormal operation judgment unit 132 compares the frequency calculated in S802 and the predetermined frequency to determine whether it is more than a predetermined frequency (S803). If the frequency calculated by S802 is less than a predetermined frequency (No in S803), the processing of the abnormality determination procedure is terminated. If the frequency calculated in S802 is greater than or equal to the predetermined frequency (Yes in S803), an alarm is issued as abnormal (S804). Assuming that the likelihood from the upper limit is set to a predetermined range, the value of the predetermined frequency at 120% of the likelihood may be smaller than the value of the predetermined frequency when it occurs at 110% of the likelihood.

When monitoring one cycle of operation, the abnormal operation judgment unit 132 does not stop the operation, but stores the locations judged to be abnormal in the memory and calculation unit 133, and after one cycle of operation is completed, it notifies the outside through the display and operation unit 106 whether the operation has been completed normally or not. In the case of FIG. 13, it can be reported to the outside through the display and operation unit 106 that an abnormality occurred between the time periods (2F) and (2G).

According to this example, if the customer system tries to determine whether the operation is normal or abnormal as an operation in one cycle period, it can determine the abnormality by preventing continuous operation from becoming impossible if a temporary peculiar phenomenon occurs and stops the system.

In FIG. 4, FIG. 7, and FIG. 9 through FIG. 13 of the above examples, output current was used as an example, but it can be replaced with monitor information data from a system coupled to an electric motor 109.

According to the above example, it is possible to avoid that the margin is too large even if the customer's system has a normal operating range. Therefore, wasteful work can be eliminated, and this can contribute to the realization of a society that does not adversely affect the global environment through environmental conservation.

The present invention is not limited to the above examples, but includes various variations. For example, the above examples are described in detail for the purpose of explaining the invention in an easy-to-understand manner, and are not necessarily limited to those having all the described configurations.

It is also possible to replace some of the configurations in one example with configurations in another example, and it is also possible to add other configurations to one example. It is also possible to add, delete, or replace some of the configurations of each example with other configurations.

In addition, each of the above compositions, functions, processing sections, processing means, etc., may be realized in hardware by designing some or all of them, for example, in an integrated circuit. In addition, each of the above compositions, functions, etc. may be realized in software by a processor interpreting and executing a program that realizes the respective function. The programs, tables, files, and other information that realize each function may be placed in memory, a hard disk, SSD (Solid State Drive), or other recording device, or in a recording medium such as an IC card, SD card, or DVD.

In addition, control and information lines are those considered necessary for illustrative purposes, and not all control and information lines are necessarily shown in the product. In reality, almost all components may be considered to be interconnected.

REFERENCE SIGNS LIST

101: three-phase AC power supply
102: DC converter
103: smoothing capacitors
104: AC converter
105: AC motor
106: display and operation unit
109: system coupled to an electric motor
111: input-side voltage detector
112: diode section temperature sensor
113: DC voltage detector
1141: output-side voltage detector
1142: inverter section temperature sensor
1151: current detector
1152: electric motor temperature sensor
1153: speed detector
119: external signal detector
121: input voltage detector
122: diode temperature detection unit
123: DC voltage detector
1241: output voltage detector
1242: inverter temperature detection unit
1251: current detection section
1252: electric motor temperature detection unit
1253: speed detector
129: external signal detector
130: arithmetic unit
131: output control unit
132: abnormal operation judgment unit
133: memory & calculation unit

The invention claimed is:

1. A power converter comprising:

a power conversion unit converts DC voltage to AC voltage provided to a device to be operated, a current detection section detects an output current from the power conversion unit, a memory section that stores a reference value of the output current detected by the current detection section or a reference value of a monitored value to be monitored from the device to be operated, and an upper limit and a lower limit determined from the reference value, a control unit configured to control the power conversion unit, wherein the control unit is configured to calculate a frequency of states exceeding the upper limit or the frequency of states below the lower limit, and compare the frequency with a predetermined frequency to determine if there is an abnormality;

wherein the control unit is configured to control operation of the power converter based on whether there is the abnormality or not; and wherein the control unit is configured to calculate the frequency to increase the further the output current is from the reference value, or the further the monitored value is from the reference value, the higher the frequency.

2. The power converter according to the claim 1, the upper limit or the lower limit is a value with a predetermined range from the reference value.

3. The power converter according to the claim 1, wherein the control unit is configured to determine an output current value of a specific frequency and use an average of the output current values as the reference value.

4. The power converter according to the claim 1, wherein the memory section is configured to accumulate values of the output current or the monitored value, and wherein the control unit is configured to calculate the upper limit and the lower limit that vary with the reference value and set them as the upper and lower limits.

5. The power converter according to the claim 1, wherein the control unit is configured to control the power converter to stop and output a notification if the abnormality is determined.

6. The power converter according to the claim 5, wherein the control unit is configured to output the notification after completing one cycle of operation if the abnormality is detected.

7. The power converter according to the claim 1, wherein the control unit is configured to set the upper limit or the lower limit so that the output current or the monitored value appears at a predetermined rate of said predetermined frequency.

8. The power converter according to the claim 1, wherein the control unit is configured to store the timing in the memory section at which the abnormality is determined.

9. The power converter according to the claim 1, wherein the device to be operated is connected to an electric motor, and wherein the control unit obtains the monitored value from an external signal detector that detects a state of the device being operated.

* * * * *